United States Patent [19]
Brown et al.

[11] Patent Number: 5,436,578
[45] Date of Patent: Jul. 25, 1995

[54] CMOS OUTPUT PAD DRIVER WITH VARIABLE DRIVE CURRENTS ESD PROTECTION AND IMPROVED LEAKAGE CURRENT BEHAVIOR

[75] Inventors: Charles A. Brown; George C. Reick, both of Corvallis, Oreg.; Charles E. Moore, Loveland, Colo.

[73] Assignee: Hewlett-Packard Corporation, Palo Alto, Calif.

[21] Appl. No.: 91,705

[22] Filed: Jul. 14, 1993

[51] Int. Cl.[6] ........................ H03K 19/003
[52] U.S. Cl. ........................ 326/87; 326/33
[58] Field of Search ........... 307/451, 443, 475, 263, 307/579; 326/87, 33

[56] References Cited

U.S. PATENT DOCUMENTS

| | | | |
|---|---|---|---|
| 4,682,055 | 7/1987 | Upadhyayula | 307/443 |
| 4,745,305 | 5/1988 | Crafts | 307/443 |
| 4,775,809 | 10/1988 | Watanabe | 307/451 |
| 4,855,623 | 8/1989 | Flaherty | 307/451 |
| 4,965,469 | 10/1990 | Kondon et al. | 307/475 |
| 4,990,802 | 2/1991 | Smooha | 307/451 |
| 5,220,216 | 6/1993 | Woo | 307/451 |
| 5,285,116 | 2/1994 | Thaik | 307/475 |
| 5,334,885 | 8/1994 | Morris | 307/443 |

*Primary Examiner*—Edward P. Westin
*Assistant Examiner*—Benjamin D. Driscoll

[57] ABSTRACT

A configurable circuit for driving an integrated circuit output pad includes two differently-sized arrays of p-channel FETs and two arrays of differently-sized n-channel FETs for driving the pad. A circuit designer selects different ones of the FETs to produce a desired level of n-channel and p-channel drive at the pad. The nonselected p-channel FETs are maintained in a disabled condition by tieing them off to one side of a p-channel FET which is also connected to a n-type island in a substrate in which the circuit is formed. Electrostatic charge is drained from the gates of the disabled FETs through the n-type island when power is not applied to the integrated circuit thereby preventing failure of leakage tests. The nonselected n-channel FETs are similarly tied to one side of an n-channel FET which in turn is tied to a p-type island to achieve the same purpose for the n-channel FETs. A photolithographic mask embodying a configurable circuit is provided to a designer who utilizes a CAD program to lay down polysilicon connections to select the drive transistors and disable the nonselected transistors.

9 Claims, 2 Drawing Sheets

CMOS OUTPUT PAD DRIVER WITH VARIABLE DRIVE CURRENTS ESD PROTECTION AND IMPROVED LEAKAGE CURRENT BEHAVIOR

BACKGROUND OF THE INVENTION

1. Field of the Invention

The present invention relates generally to a circuit for driving an integrated circuit (IC) output pad and more particularly to such a circuit which is configurable to effect different levels of output current drive. The present invention also relates generally to a method for making such a circuit.

2. Description of the Related Art

Output and input/output pads in integrated circuits are typically designed to provide a particular level of output current drive. When a different level of drive is needed, a new pad is designed. This approach requires a new pad design each time a different level of pad drive current is needed. In an effort to reduce pad design time, configurable circuits for driving an IC output pad were developed. One such circuit includes a plurality of field effect transistors (FETs) which are connected together in parallel. Typically there are two arrays of such FETs, one comprising an array of n-channel FETs connected together in parallel and the other comprising an array of p-channel FETs also connected together in parallel. One side of the n-channel FETs is connected to the pad and the other is grounded to provide sourcing drivers. One side of the p-channel FETs is also connected to the pad with the other side being connected to a power supply to provide sinking drivers.

Such a circuit for driving an IC output pad is embodied in a photolithographic mask formed by a prior art computer program. A circuit designer can then create additional artwork, utilizing the computer program, which adds connections to the circuit that tie off the gates of some of the FETs, thereby maintaining them in a permanently off condition, and that tie together the gates of the remaining FETs for driving the output pad responsive to a drive signal provided by the integrated circuit.

Tieing off the unused FETs directly to ground, in the case of n-channel FETs, or to a power supply, in the case of p-channel FETs, compromises electrostatic discharge (ESD) protection in that the tied-off FETs punch thru at different voltages from the FETs which are not tied off. This causes the group which punches thru first to absorb most of the energy of any ESD.

It is known in the art to tie off FETs by connecting the gates of the tied-off FETs to one side of another FET which is always in an on condition when voltage is applied to the IC. This improves ESD protection for the configurable circuit. However, when tied-off FETs are connected to one side of another FET, problems arise during IC testing before power is applied to the IC. Charge can build up on the gates of the tied-off FETs to a level which causes them to turn on thus causing leakage tests to fail.

In addition, such prior art circuits provide relatively coarse adjustment of how much drive current is provided. It would be desirable to provide finer resolution of the level of output current provided at the pad and to overcome problems associated with leakage testing of the above-described prior art circuit.

SUMMARY OF THE INVENTION

A circuit for driving an IC output pad includes an array of driver transistors. Some of the transistors are tied off and some are selected for driving to produce an output signal on the pad. The nonselected transistors are connected to one side of a tie-off transistor for maintaining the nonselected transistors in an off condition. Means are provided for preventing the potential on the tie-off transistor from rising above a preselected level when the tie-off transistor is turned off.

In another aspect of the present invention, the array of driver transistors includes transistors of at least two different sizes. In still another aspect of the invention, a method is provided for making a photolithographic mask which is utilized in making the circuit of the present invention.

It is a general object of the present invention to provide a circuit for driving an IC output pad which overcomes the disadvantages associated with prior art circuits.

It is a more specific object of the present invention to provide such a circuit which permits a designer to configurate the circuit to obtain relatively fine resolution of the desired level of output drive current.

It is another more specific object of the present invention to provide such a circuit which prevents electrostatic charge from turning on the tied-off FETs.

It is another general object of the present invention to provide a method for making a circuit for driving an IC output pad.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
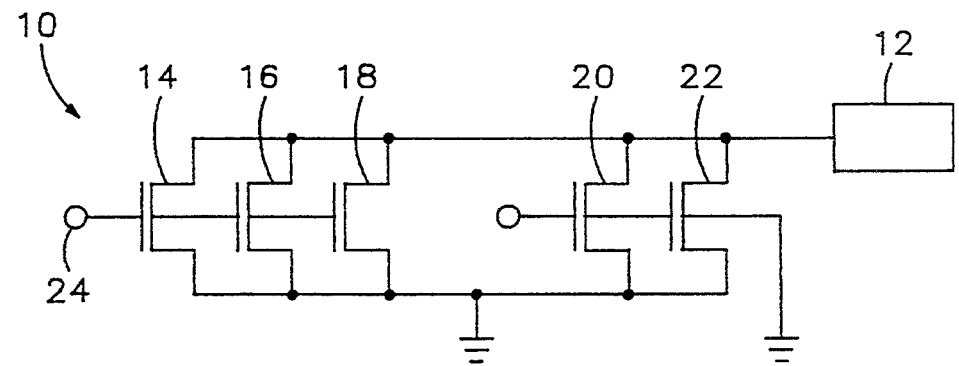
FIG. 1 is a schematic diagram of a prior art circuit for driving an IC output pad.

Turning now to FIG. 1, indicated generally at 10 is a prior art circuit for driving an IC output pad 12. Circuit 10 is embodied in an integrated circuit. Included in circuit 10 are FETs 14, 16, 18, 20, 22. The gates of FETs 20, 22 are grounded as shown and the gates of FETs 14, 16, 18 are connected to a node 24 which in turn is connected to a logic gate (not shown) that produces output signals developed by a circuit (also not shown) embodied in the IC.

FETs 20, 22, although not needed for increasing the current drive at pad 12 over and above that provided by FETs 14, 16, 18, are provided to increase the total width of FETs 14–22 to improve ESD protection. While providing the additional FETs does increase ESD protection, tieing off some (FETs 20, 22) and driving others (FETs 14, 16, 18) creates different punch thru voltages for FETs 14, 16, 18, on the one hand, and FETs 20, 22, on the other hand. This condition causes the group which punches thru first to absorb most of the ESD energy.

Figure 2:
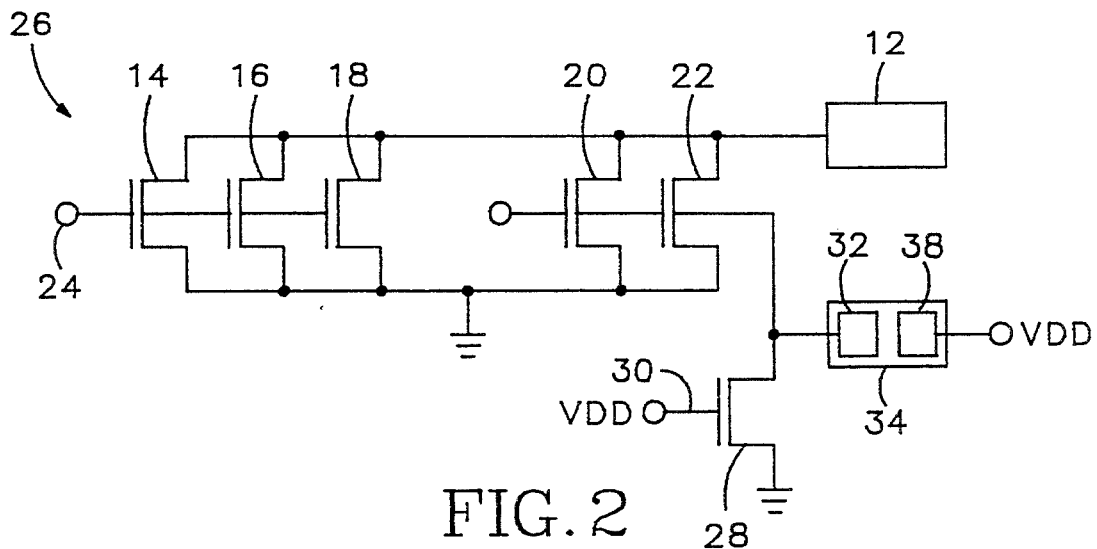
FIG. 2 is a schematic diagram of a first embodiment of a circuit for driving an IC output pad constructed in accordance with the present invention.

Turning now to FIG. 2 and indicated generally at 26 is a circuit constructed in accordance with the present invention. Structure corresponding to that previously described in FIG. 1 retains the same numeral in FIG. 2. Circuit 26 includes a tie-off FET 28, also an n-channel FET like FETs 14–22. FET 28 includes a gate 30 which is connected to VDD, a +5 volt power supply, as shown. Tieing FETs 20, 22, which are thereby disabled, to one side of tie-off FET 28 tends to equalize the punch thru voltages of FETs 14–18 and FETs 20, 22 and thus improves ESD performance relative to circuit 10 in FIG. 1. The circuit permits charge to build up on the common gates of FETs 20, 22 when power is not applied to the IC in which circuit 26 is embodied. FETs 20, 22 turn on and thus cause leakage tests of the IC in which circuit 26 is embodied to fail.

Figure 3:
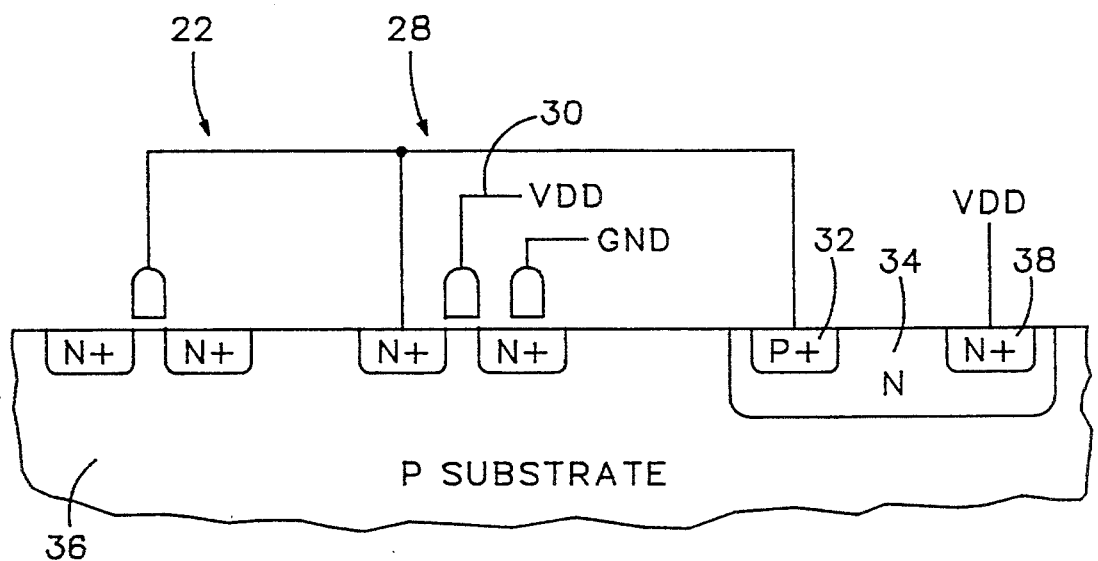
FIG. 3 is a schematic diagram of a portion of a semiconductor embodying the circuit of FIG. 2.

In accordance with the present invention, one side of FET 28 is connected to p-type island 32. With reference to FIG. 3, it can be seen that p-type island 32 is formed in an n-type well 34 which is diffused into a p-type substrate 36. The remainder (not shown) of the IC is also formed in substrate 36. Well 34 includes an n-type island 38 to facilitate a connection between the well and VDD, the +5 volt DC power supply. Without a p-type island 32, the circuit permits charge to build up on the common gates of FETs 20, 22 when power is not applied to the IC in which circuit 26 is embodied. If charge builds up to +2 volts or more, FETs 20, 22 turn on and thus cause leakage tests of the IC in which circuit 26 is embodied to fail.

Operation of circuit 26 in FIG. 2 will now be considered. When power is not applied to the IC in which circuit 26 is embodied, any charge accumulating on the common gates of FETs 20, 22 forward biases the junction between p-type island 32 and n-type well 34 thus draining the charge from the gates. This prevents a potential above that required to forward bias the junction between island 32 and well 34 from forming on the gates of FETs 20, 22. The potential required to forward bias the junction is just under that required to turn on FETs 20, 22. Thus, when power is not applied to the IC, FETs 20, 22 cannot be turned on and therefore do not cause leakage tests to fail as a result of being turned on when power is not applied to the IC.

When power is applied to the IC, VDD is applied to the n-type island 38 thereby reverse-biasing the junction between p-island 32 and n-type well 34. With VDD applied to gate 30 of FET 28, FETs 20, 22 are tied to ground via FET 28 which is how the designer selects the desired drive level he needs and no more or less.

Figure 4:
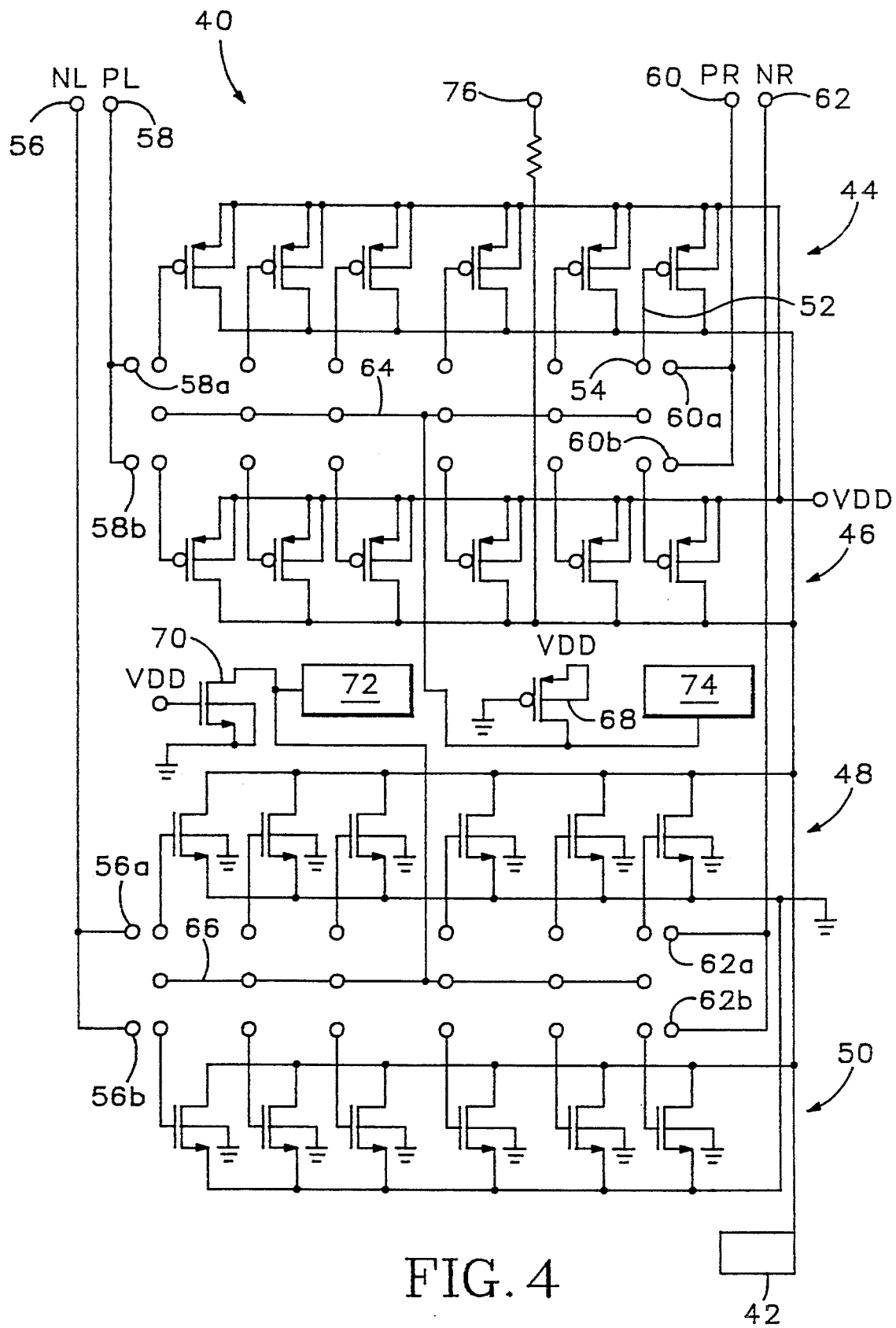
FIG. 4 is a schematic diagram of a second embodiment of a circuit, and of a photolithographic mask used to create the circuit, for driving an IC output pad constructed in accordance with the present invention.

Turning now to FIG. 4, indicated generally at 40 is a schematic diagram of a circuit, and of a photolithographic mask used to create the circuit, constructed in accordance with the present invention. Reference to circuit components herein should also be considered to refer to corresponding structure in a mask used to create an integrated circuit embodying the invention. Diagram 40 includes an IC output pad 42. The pad is drivable by first, second, third and fourth arrays, 44, 46, 48, 50, respectively, of FET driver transistors. Arrays 44, 46 comprise p-type channel FETs, which are referred to herein as FETs of a first polarity type. The n-type FETs in arrays 48, 50 are referred to herein as FETs of a second polarity type.

The FETs in array 44 are 54.4 microns wide by 1.6 microns in length, the FETs in array 46 are 34.4 microns wide by 1.6 microns in length, the FETs in array 48 are 62.4 microns in length by 1.6 microns long and the FETs in array 50 are 38.4 microns wide by 1.6 microns in length. As can be seen with reference to the following Table 1, different combinations of the FETs in arrays 44, 46 can be used to drive pad 42 to provide a total drive current as shown in the table. Similarly, different combinations of the FETs in arrays 48, 50 can be used to drive pad 42 to produce one of the current drive levels shown in the following Table 2. The manner in which the FETs in each of the arrays are selected or tied off is described hereinafter.

TABLE 1

| 54.40 | 34.40 | width | 54.40 | 34.40 | width |
|---|---|---|---|---|---|
| 0 | 0 | 0.0u | 5 | 0 | |
| 0 | 1 | 34.4u | 2 | 5 | 272.0u |
| 1 | 0 | 54.4u | 4 | 2 | 280.8u |
| 0 | 2 | 68.8u | 4 | 2 | 286.4u |
| 1 | 1 | 88.8u | 3 | 4 | 300.8u |
| 0 | 3 | 103.2u | 5 | 1 | 306.4u |
| 2 | 0 | 108.8u | 2 | 6 | 315.2u |
| 1 | 2 | 123.2u | 4 | 3 | 320.8u |
| 0 | 4 | 137.6u | 6 | 0 | 326.4u |
| 2 | 1 | 143.2u | 3 | 5 | 335.2u |
| 1 | 3 | 157.6u | 5 | 2 | 340.8u |
| 3 | 0 | 163.2u | 4 | 4 | 355.2u |
| 0 | 5 | 172.0u | 6 | 1 | 360.8u |
| 2 | 2 | 177.6u | 3 | 6 | 369.6u |
| 1 | 4 | 192.0u | 5 | 3 | 375.2u |
| 3 | 1 | 197.6u | 4 | 5 | 389.6u |
| 0 | 6 | 206.4u | 6 | 2 | 395.2u |
| 2 | 3 | 212.0u | 5 | 4 | 409.6u |
| 4 | 0 | 217.6u | 4 | 6 | 424.0u |
| 1 | 5 | 226.4u | 6 | 3 | 429.6u |
| 3 | 2 | 232.0u | 5 | 5 | 444.0u |
| 2 | 4 | 246.4u | 6 | 4 | 464.0u |
| 4 | 1 | 252.0u | 5 | 6 | 478.4u |
| 1 | 6 | 260.8u | 6 | 5 | 498.4u |
| 3 | 3 | 266.4u | 6 | 6 | 532.8u |

TABLE 2

| 62.4u | 38.40u | width | 62.4u | 38.40u | width |
|---|---|---|---|---|---|
| 0 | 0 | 0.0u (in only) | | | |
| 0 | 1 | 38.4u | 5 | 0 | 312.0u |
| 1 | 0 | 62.4u | 2 | 5 | 316.8u |
| 0 | 2 | 76.8u | 4 | 2 | 326.4u |
| 1 | 1 | 100.8u | 3 | 4 | 340.8u |
| 0 | 3 | 115.2u | 5 | 1 | 350.4u |
| 2 | 0 | 124.8u | 2 | 6 | 355.2u |
| 1 | 2 | 139.2u | 4 | 3 | 364.8u |
| 0 | 4 | 153.6u | 6 | 0 | 374.4u |
| 2 | 1 | 163.2u | 3 | 5 | 379.2u |
| 1 | 3 | 177.6u | 5 | 2 | 388.8u |
| 3 | 0 | 187.2u | 4 | 4 | 403.2u |
| 0 | 5 | 192.0u | 6 | 1 | 412.8u |
| 2 | 2 | 201.6u | 3 | 6 | 417.6u |
| 1 | 4 | 216.0u | 5 | 3 | 427.2u |
| 3 | 1 | 225.6u | 4 | 5 | 441.6u |
| 0 | 6 | 230.4u | 6 | 2 | 451.2u |
| 2 | 3 | 240.0u | 5 | 4 | 465.6u |
| 4 | 0 | 249.6u | 4 | 6 | 480.0u |
| 1 | 5 | 254.4u | 6 | 3 | 489.6u |
| 3 | 2 | 264.0u | 5 | 5 | 504.0u |
| 2 | 4 | 278.4u | 6 | 4 | 528.0u |
| 4 | 1 | 288.0u | 5 | 6 | 542.4u |
| 1 | 6 | 292.8u | 6 | 5 | 566.4u |
| 3 | 3 | 302.4u | 6 | 6 | 604.8u |

Each transistor array, like array 44, includes a connection from the gate of each FET in the array to a corresponding gate node, such as a connection 52 to gate node 54 in array 44. All of the gate nodes in each array are aligned to facilitate connection of the nodes as hereinafter described.

The circuit depicted in diagram 40 includes four input signals which enable selected ones of the transistors as will be shortly described. The input signals include an n-type, left-side signal (NL at node 56), a p-type, left-side signal (PL at node 58), a p-type, right-side signal (PR at node 60) and an n-type, right-side signal (NR at node 62). The n-type signals are provided to the n-channel FETs in arrays 48, 50 at nodes 56a, 56b, 62a, 62b while the p-signals are applied to the p-channel FETs in arrays 44, 46 at nodes 58a, 58b, 60a, 60b. The left-side signals are applied to the left side of all four arrays at nodes 58a, 58b, 56a, 56b while the right-side signals are applied to the right side of each array at nodes 60a, 60b, 62a, 62b. The signals are provided at nodes 56, 58, 60, 62 by circuitry (not shown) in the IC which drive the circuit in diagram 40 to produce a corresponding output signal on pad 42.

Tie-off lines 64, 66 are formed between the gate nodes in arrays 44, 46 and arrays 48, 50, respectively. Tie-off line 64 is connected to one side of a p-channel, tie-off FET 68 and tie-off line 66 is connected to one side of an n-channel, tie-off FET 70. One side of tie-off FET 70 is connected to a p-type island 72 and one side of FET 68 is connected to an n-type island 74. As will be seen, the circuit depicted in diagram 40 may be configured by connecting the gate nodes, on the mask corresponding to diagram 40, of selected ones of the transistors in arrays 48, 50 to tie-off line 66. When the mask, and thus the circuit, is so configured, the tied-off transistors in array 48, 50 are tied-off in the same manner as FETs 20, 22 in FIG. 2, i.e., each gate is connected to one side of a tie-down FET which in turn is connected to a p-type island. As in the circuit of FIG. 2, this structure prevents the tied-off FETs from being turned on as a result of electrostatic charge accumulation when power is not applied to the IC in which the circuit depicted in diagram 40 is embodied.

Tie-off FET 68 and related n-type island 74 serve the same function for the p-channel FETs in arrays 44, 46, i.e., when power is not applied to the IC, any negative charge accumulating on line 64 forward biases n-type island 74 relative to the p-type substrate, like that in FIG. 3, in which island 74 is formed. Such biasing prevents the potential on line 64 from reaching that sufficient to turn on the FETs in arrays 44, 46, which, as is described hereinafter, have selected ones of their gate nodes connected to tie-off line 64.

An input node 76 is provided for passing an input signal supplied to pad 42 to an input node of circuitry (not shown) embodied in the IC.

Integrated circuit designers generally utilize computer-aided design software packages for generating photolithographic masks which are in turn used in a known manner to construct an integrated circuit. Such software packages are commercially available and include design environment programs such as OPUS manufactured by Cadence and the FALCON design environment program manufactured by Mentor Graphics of Portland, Oreg. Diagram 40, which is also referred to herein as a base mask, is provided as a file in the computer program to a designer who configures the pad to produce a desired level of drive current at pad 42. With reference to Table 1, the designer first determines which of the obtainable current drive levels in Table 1 is most suitable. Then, the designer utilizes the computer program to generate a polysilicon connection in a straight line from nodes 58a, 60a and nodes 58b, 60b to connect the appropriate number of FETs in each of arrays 44, 46 to nodes 58, 60, respectively for driving the selected FETs to produce the selected current level in pad 42. The gate nodes of each of the nonselected FETs are tied directly to tie-off line 64 by creating a polysilicon connection between each gate and a corresponding opposite connection node on line 64. In the case where only a single drive level is desired from the p-channel FETs, the same drive signal is applied to nodes 58, 60 thus driving the selected FETs together. Alternatively, different drive signals can be applied to nodes 58, 60 thus permitting different levels of current drive to appear on pad 42 from arrays 44, 46.

Utilizing Table 2, FETs in arrays 48, 50 are selected to provide a desired level of current drive at pad 42 from the n-channel FETs. Polysilicon connections are made from nodes 56a, 56b and nodes 62a, 62b, each in a straight line, to connect a preselected number of the FETs in arrays 48, 50 to the enable signals appearing at nodes 56, 62. The nonselected FETs in arrays 48, 50 are connected with a polysilicon connection to tie-off line 66.

The present invention therefore provides a designer with the ability to finely resolve a desired level of output current drive at a pad without inadvertently comprising the ESD protection while preventing electrostatic charge from building up to a level of which could turn on one of the tied-off FETs when no power is applied to the integrated circuit.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A circuit for driving an output pad for an IC comprising:
    an array of driver transistors connected to the output pad;
    means for driving selected ones of the driver transistors to produce an output signal on the pad;
    a tie-off transistor;
    means for connecting each of the transistors not driven by the driving means to one side of the tie-off transistor for maintaining the array transistors connected to the tie-off transistor in an off condition; and
    means for preventing the potential on said one side of said tie-off transistor from rising above a preselected level when said tie-off transistor is turned off so that no leakage current is produced by the array transistors connected to the tie-off transistor when power is not applied to the IC.

2. The circuit of claim 1 wherein said tie-off transistor comprises a semiconductor substrate including a dopant of a first polarity type and a pair of regions formed in said substrate which include a dopant of a second polarity type and wherein said means for preventing the potential on said one side of said tie-off transistor from rising above a preselected level comprises a connection between one of said region pairs and a discharge region formed in said substrate and including a dopant of said first polarity type.

3. The circuit of claim 2 wherein said driver transistors and said tie-off transistor comprise FETs.

4. The circuit of claim 3 wherein said tie-off transistor is an n-type FET, said dopant of said first polarity type comprises n-type dopant and said dopant of said second polarity type comprises p-type dopant.

5. The circuit of claim 3 wherein said tie-off transistor is a p-type FET, said dopant of said first polarity type comprises p-type dopant and said dopant of said second polarity type comprises n-type dopant.

6. A configurable driver circuit for an output pad having improved electrostatic discharge protection of an IC, the pad comprising:
 a first array of transistors connected to the output pad, the transistors in the first array being of a first type;
 a second array of transistors connected to the output pad, the transistors in the second array being of a second type;
 first means for discharging excess charge build up on the first array transistors comprised of a first tie-off transistor having a gate coupled to a first supply voltage, a source coupled to a second supply voltage, and a drain; and a first island of a first dopant type coupled to the drain of the first tie-off transistor which prevents the first array transistors from turning on when power is not applied to the IC;
 second means for discharging excess charge build up on the second array transistors comprised of a second tie-off transistor having a gate coupled to a second supply voltage, a source coupled to a first supply voltage, and a drain; and a second island of a second dopant type coupled to the drain of the second tie-off transistor which prevents the second array transistors from turning when power is not applied to the IC;
 means for selectively connecting selected transistors in the first array to a first drive node for receiving a first drive signal;
 means for selectively connecting selected transistors in the second array to a second drive node for receiving a second drive signal;
 means for selectively connecting the transistors in the first array not connected to the first drive node to the first discharging means, wherein the first discharging means eliminates leakage current due to the transistors connected thereto; and
 means for selectively connecting the transistors in the second array not connected to the second drive node to the second discharging means, wherein the second discharging means eliminates leakage current due to the transistors connected thereto.

7. A configurable driver for an IC output pad according to claim 6 wherein the means for selectively connecting selected transistors in the first array to a first drive node includes:
 a first array of control nodes connected to the first array of transistors, each control node being connected to a gate of a corresponding transistor,
 wherein the control nodes are aligned with the first drive node for receiving an interconnect layer to connect a selected number of the control nodes to the first drive node.

8. A configurable driver for an IC output pad according to claim 6 wherein the means for selectively connecting to the first discharging means the transistors in the first array not coupled to the first drive node includes:
 a tie-off line connected to the first island and having an array of tie-off nodes spaced therealong, each node being associated with a control node of a corresponding first array transistor,
 wherein the tie-off nodes are aligned with the first drive node for receiving an interconnect layer to connect the control nodes not connected to the first drive node to the tie-off line.

9. A configurable driver for an IC output pad according to claim 6 including:
 a third array of transistors connected to the output pad, the transistors in the third array being of the first type; and
 a fourth array of transistors connected to the output pad, the transistors in the fourth array being of the second type.

* * * * *